United States Patent [19]

Doran et al.

[11] 4,066,863

[45] Jan. 3, 1978

[54] METHOD AND SYSTEM FOR AUTOMATICALLY CORRECTING ABERRATIONS OF A BEAM OF CHARGED PARTICLES

[75] Inventors: Samuel K. Doran, Wappingers Falls; Merlyn H. Perkins, Hopewell Junction, both of N.Y.

[73] Assignee: International Business Machines Corporation, Armonk, N.Y.

[21] Appl. No.: 483,267

[22] Filed: June 26, 1974

[51] Int. Cl.² ............................................. B23K 15/00
[52] U.S. Cl. ...................... 219/121 EM; 219/121 EB
[58] Field of Search ................. 219/121 EB, 121 EM; 315/370, 382, 31 R

[56] References Cited

U.S. PATENT DOCUMENTS

| 2,831,145 | 4/1958 | Albert et al. | 315/370 |
| 2,951,965 | 9/1960 | Durnal | 315/382 |
| 3,150,284 | 9/1964 | Comeau | 315/370 |
| 3,422,305 | 1/1969 | Infante | 315/370 X |
| 3,619,707 | 11/1971 | Simshauser | 315/31 R |
| 3,644,700 | 2/1972 | Kruppa et al. | 219/121 EB |
| 3,714,496 | 1/1973 | Horvath | 315/370 X |
| 3,740,608 | 6/1973 | Manber et al. | 315/370 X |
| 3,793,554 | 2/1974 | Rossaert | 315/370 |
| 3,806,758 | 4/1974 | Lundgvist | 315/31 R |

Primary Examiner—J. V. Truhe
Assistant Examiner—Clifford C. Shaw
Attorney, Agent, or Firm—Frank C. Leach, Jr.; Theodore E. Galanthay

[57] ABSTRACT

The location of a beam of charged particles within a deflection field is determined by its orthogonal deflection voltages. With the location of the beam in the field, correction currents are supplied to a focus coil and to each of a pair of stigmator coils to correct for change of focal length and astigmatism due to the beam being deflected away from the center of its deflection field.

57 Claims, 13 Drawing Figures

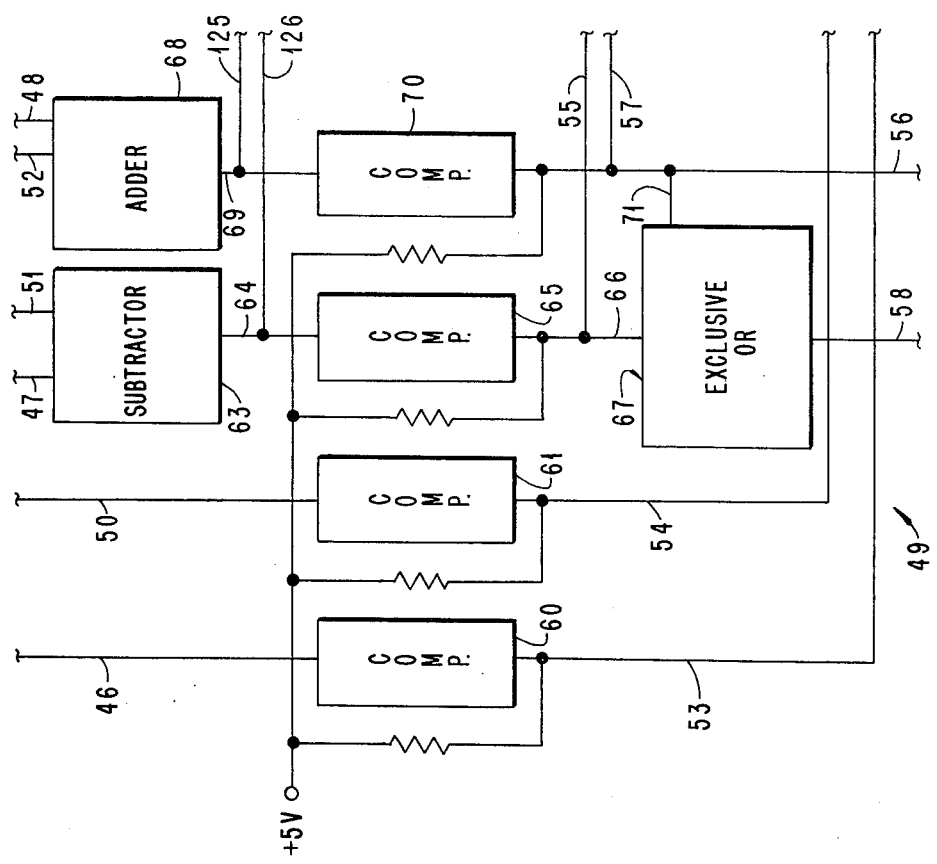
FIG. 3
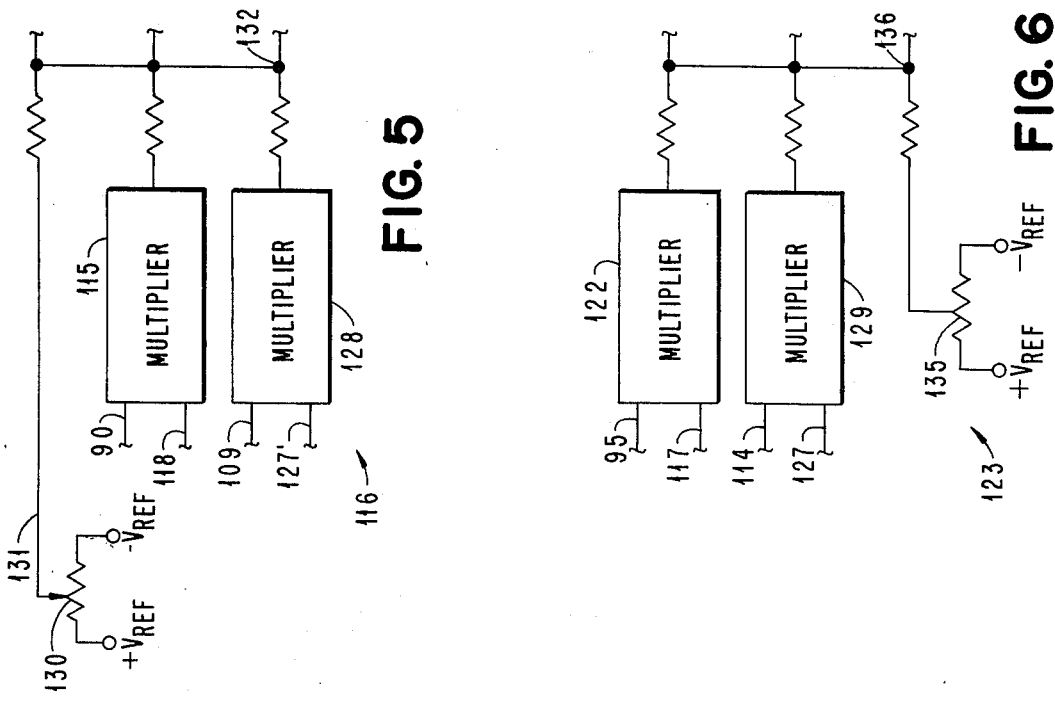
FIG. 5
FIG. 6

METHOD AND SYSTEM FOR AUTOMATICALLY CORRECTING ABERRATIONS OF A BEAM OF CHARGED PARTICLES

In each of U.S. Pat. No. 3,644,700 to Kruppa et al and the copending patent application of Michel S. Michail et al for "Method And Apparatus For Positioning A Beam Of Charged Particles," Ser. No. 437,585, filed Jan. 28, 1974, now U.S. Pat. No. 3,900,736 and assigned to the same assignee as the assignee of this application, there is shown a method and apparatus for controlling a square-shaped beam. The beam is deflected throughout a writing field on a semiconductor wafer to write a desired pattern.

Since the wafer has a substantially flat surface, any deflection of the beam from the center of the deflection field, which also functions as the writing field, results in the beam no longer being focused at the surface of the wafer. As the beam is deflected further from the center of the field, the focal point of the beam moves further away from the surface of the wafer.

To obtain good focus of the beam at any point to which it is deflected within the field, it is necessary for the focal length of the beam to be changed. The focal length must be increased as the distance of the beam from the center of the field increases. Thus, in a square-shaped deflection field, for example, the corners of the field are the maximum distance from the center of the field and would require the maximum increase in the focal length of the beam.

As the beam is deflected from the center of the field, it is projected through a different portion of the projection lens. As a result of this shift of the beam to different portions of the projection lens, the astigmatism of the beam changes.

If the beam has astigmatism, then the beam cannot be properly focused. This is because the focus will get better in one of the orthogonal deflection directions in which the beam is deflected but worse in the other.

The astigmatism is effective along all edges of the field of the beam. Thus, it is necessary to correct for the astigmatism not only at the corners of the field but also along the sides.

The present invention satisfactorily solves the foregoing problems through providing a method and system for dynamically correcting the focus and astigmatism of the beam for any position in the entire field to which the beam is deflected. Thus, the present invention enables the beam to be properly focused irrespective of the position to which it is deflected.

The present invention accomplishes the foreging through utilizing the deflection voltages, which are in orthogonal X and Y directions, to indicate the location of the beam in the field. With the use of empirical data obtained for the beam, a relationship between the deflection location, as indicated by the deflection voltages in the X and Y directions, and the necessary currents for correcting both focus and astigmatism are obtained.

The present invention utilizes the deflection voltages not only for ascertaining the location of the beam in the field but also for generating the voltages to produce the currents for correcting the focus and astigmatism of the beam. That is, after the beam has been located in a particular sector of the field by processing signals relating to the magnitudes of the deflection voltages in the X and Y directions, a function generator is employed to generate voltages related to the deflection voltages and coefficients which are selected in accordance with a sector of the field, which is divided into sectors, in which the beam is located.

The system of the present invention switches the coefficients only at a time when the voltage magnitude, which is related to one or both of the deflection voltages and is being multiplied by the coefficient, is at zero. This eliminates any discontinuities in the correction function.

An object of this invention is to provide a method and system for dynamically correcting the aberrations of a beam of charged particles when the beam is deflected from the center of its deflection field.

Another object of this invention is to provide a method and system for correcting the focus and the astigmatism of a beam of charged particles without any discontinuity in the correction thereof.

The foregoing and other objects, features, and advantages of the invention will be apparent from the following more particular description of the preferred embodiment of the invention as illustrated in the accompanying drawings.

In the drawings:

FIG. 3 is a block diagram of a sector decoder of the circuitry of FIG. 2.

FIG. 5 is a block diagram of a function generator of FIG. 2 for generating the voltage to produce the current for one of the stigmator coils.

FIG. 6 is a block diagram of a function generator of FIG. 2 for generating the voltage to produce the current for the other of the stigmator coils.

Figure 1:
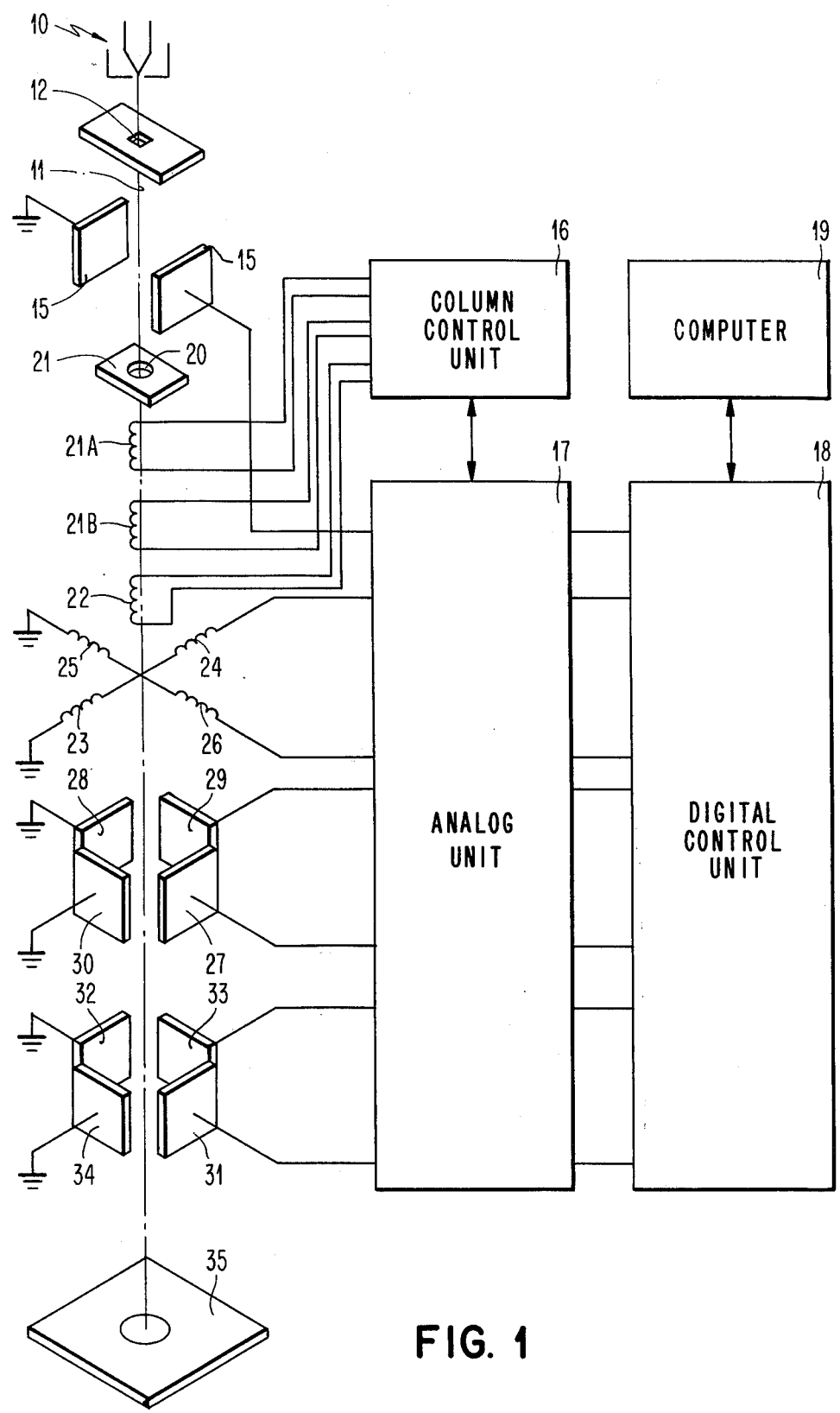
FIG. 1 is a schematic view showing a beam of charged particles and the apparatus for controlling the beam.

Referring to the drawings and particularly FIG. 1, there is shown an electron gun 10 for producing a beam 11 of charged particles in the well-known manner. As shown and described in the aforesaid Michail et al application, the electron beam 11 is passed through an aperture 12 in a plate 14 to shape the beam 11. The beam 11 is preferably square shaped and has a size equal to the minimum line width of the pattern that is to be formed.

The beam 11 passes between a pair of blanking plates 15, which determine when the beam 11 is applied to a target and when the beam 11 is blanked. The blanking plates 15 are controlled by circuits of an analog unit 17, which has a column control unit 16 connected thereto.

The analog unit 17 is controlled by a digital control unit 18 in the manner more particularly shown and described in the copending patent application of Philip M. Ryan for "Method And Apparatus For Controlling Movable Means Such As An Electron Beam," Ser. No. 398,734, filed Sept. 19, 1973, now U.S. Pat. No. 3,866,013 and assigned to the same assignee as the assignee of this application. The digital control unit 18 is connected to a computer 19, which is preferably an IBM 370 computer.

The beam 11 then passes through a circular aperture 20 in a plate 21. This controls the beam 11 so that only the charged particles passing through the centers of the lenses (not shown) are used so that a square-shaped spot without any distortion is produced.

The beam 11 is next directed through stigmator coils 21A and 21B and then through a focus coil 22. The stigmator coils 21A and 21B and the focus coil 22 are connected to the column control unit 16.

Figure 11:
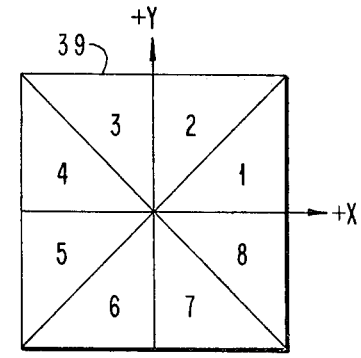
FIG. 11 is a schematic view of a deflection field showing its division into sectors to enable location of the beam within a sector of the field.

After passing through the focus coil 22, the beam 11 is directed through magnetic deflection coils 23, 24, 25, and 26. The magnetic deflection coils 23 and 24 control the deflection of the beam 11 in a horizontal or X direction as shown in FIG. 11 while the magnetic deflection coils 25 and 26 control the deflection of the beam 11 in a vertical or Y direction as shown in FIG. 11. Accordingly, the coils 23–26 cooperate to move the beam in a horizontal scan by appropriately deflecting the beam 11.

While the beam 11 could be moved in a substantially raster fashion as shown and described in the aforesaid Kruppa et al patent, it is preferably moved in a back and forth scan so that the beam 11 moves in opposite directions along adjacent lines as shown and described in the aforesaid Ryan and Michail et al applications. Thus, the negative bucking sawtooth of the type shown in FIG. 3b of the aforesaid Kruppa et al patent is supplied to the coils 23 and 24 during forward scan while a positive bucking sawtooth, which is of opposite polarity to the sawtooth shown in FIG. 3b of the aforesaid Kruppa et al patent, is supplied to the coils 23 and 24 during the backward scan.

As shown and described in the aforesaid Michail et al application, the beam 11 then passes between a first set of electrostatic deflection plates 27, 28, 29, and 30. The electrostatic deflection plates 27 and 28 cooperate to deflect the beam in a horizontal or X direction as shown in FIG. 11 while the electrostatic deflection plates 29 and 30 cooperate to move the beam 11 in a vertical or Y direction as shown in FIG. 11. The plates 27–30 are employed to provide any desired offset of the beam 11 at each of the predetermined positions or spots to which it is moved. In the aforesaid Kruppa et al patent, the plates 27–30 corrected for linearity, but these correction signals are supplied to the coils 23–26 in the aforesaid Michail et al application and in this application.

After passing between the electrostatic deflection plates 27–30, the beam 11 then passes between a second set of electrostatic deflection plates 31, 32, 33, and 34. The electrostatic deflection plates 31 and 32 cooperate to deflect the beam 11 in the horizontal or X direction while the electrostatic deflection plates 33 and 34 cooperate to deflect the beam 11 in the vertical or Y direction. The plates 31 and 32 deflect the beam 11 in the X direction and the plates 33 and 34 deflect the beam 11 in the Y direction from each of the predetermined positions to which it is moved in accordance with its predetermined pattern so that the beam 11 is applied to its actual position based on the deviation of the area from its designed position, both shape and location, in which the beam 11 is to write as more particularly shown and described in the aforesaid Michail et al application.

The beam 11 is then applied to a target, which is supported on a table 35 and can be a semiconductor wafer, for example. The table 35 is movable in the X and Y directions as more particularly shown and described in the aforesaid Kruppa et al patent.

The beam 11 is moved through A, B, and C cycles as shown and described in the aforesaid Kruppa et al patent and the aforesaid Michail et al application. The present invention is concerned with correcting the focus and astigmatism of the beam 11 at any position in a deflection field 39 (see FIG. 11) of the semiconductor wafer to which it is deflected from the center of the deflection field 39 during the A, B, and C cycles.

As shown in the aforesaid Michail et al application, a plurality of fields is provided on the semiconductor wafer. The beam 11 is capable of being deflected to any portion of the deflection field 39, which also serves as a writing field during the B cycle.

The deflection of the beam 11 from the center of the field 39 results in a change in the focal length of the beam 11 since the surface of the wafer is deemed to be substantially flat. It also results in the beam 11 having astigmatism because the beam 11 is shifted to different portions of the projection lens as it is deflected from the center of the deflection field 39.

It has been determined that the current, $i_f$, to the focus coil 22 can be changed for any position of the beam 11 within the field 39 to automatically correct for change in the required focal length through using the equation $$i_f = (a + b)(X^2 + Y^2) + (a - b)(2XY) + k \qquad (1)$$

where $a$ and $b$ are coefficients that are selected depending upon the location of the beam 11 in the field 39, X is the magnitude of the magnetic deflection voltage supplied to the X magnetic deflection coils 23 and 24 at the position to which the beam 11 is deflected, Y is the magnitude of the magnetic deflection voltage supplied to the Y magnetic deflection coils 25 and 26 at the position to which the beam 11 is deflected, and $k$ is a constant dependent upon the wafer thickness and the processing layers thereon at the particular time. The constant $k$ also includes the center focus correction of the focus coil 22 and the focus servo output for maintaining the quality of the focus of the focus coil 22 as more particularly shown and described in our copending patent application for "Method And System For Correcting An Aberration Of A Beam Of Charged Particles," Ser. No. 483,266, filed June 26, 1974, now U.S. Pat. No. 3,924,156 and assigned to the same assignee as the assignee of this application.

The current, $i_s$, to each of the stigmator coils 21A and 21B for automatically correcting the astigmatism of the beam 11 in accordance with its position in the field 39 is defined by the equation $$i_s = a(|X| - |Y|) + b(|X + Y| - |Y - X|) + k \qquad (2)$$

where $a$ and $b$ are the coefficients that are selected depending upon the location of the beam 11 in the field 39, $|X|$ is the absolute value of the magnitude of the voltage supplied to the X magnetic deflection coils 23 and 24 for the position at which the beam 11 is disposed, $|Y|$ is the absolute value of the magnitude of the magnetic voltage supplied to the Y magnetic deflection coils 25 and 26 for the position to which the beam 11 is disposed, $|X + Y|$ is the absolute value of the sum of the magnetic deflection voltages supplied to the X magnetic deflection coils 23 and 24 and the Y magnetic deflection coils 25 and 26 for the position at which the beam 11 is disposed, $|Y - X|$ is the absolute value of the difference of the magnetic voltages supplied to the X magnetic deflection coils 23 and 24 and the Y magnetic deflection coils 25 and 26 for the position at which the beam 11 is disposed, and $k$ is a constant.

When each of equations (1) and (2) is utilized to control the currents to the focus coil 22 and the stigmator coils 21A and 21B, respectively, correction for both astigmatism and focus of the beam 11 due to its deflection from the center of the deflection field 39 is automatically made.

To be able to properly locate where the beam 11 is disposed in the field 39 in accordance with the X and Y magnetic deflection voltages, the field 39 is divided into eight sectors as shown in FIG. 11. The X axis is the horizontal line through the center of the field 39 with $+X$ being the direction to the right from the center of the field 39 and the Y axis is the vertical line through the center of the field 39 with $+Y$ being the upward direction from the center of the field 39. Diagonal lines extending between the corners of the field 39 are also utilized with the X and Y axes to produce the eight sectors as indicated by sectors 1, 2, 3, 4, 5, 6, 7, and 8 in FIG. 11. Thus, X is positive in sectors 1, 2, 7, and 8, Y is positive in sectors 1, 2, 3, and 4, $-(Y-X)$ is positive in sectors 1, 6, 7, and 8, and $-(X+Y)$ is positive in the sectors 4, 5, 6, and 7.

Figure 12:
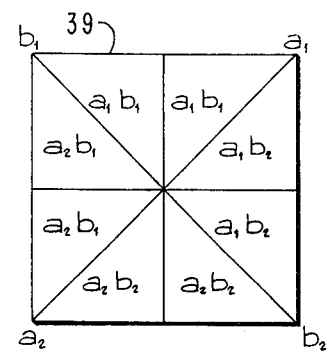
FIG. 12 is a schematic view of the field of FIG. 11 showing the coefficients for each sector of the field for the equation for the focus coil currant.

To correct for the deflection of the focus of the beam 11 from the center of the deflection field 39, it is only necessary to have a maximum correction at each of the corners of the field 39. Therefore, it is only necessary to dispose coefficients $a_1$ and $a_2$ at opposite corners of the field 39 and coefficients $b_1$ and $b_2$ at the other of the two diagonally disposed corners of the field 39 to satisfy equation (1) for the focus coil current to the focus coil 22. This is shown in FIG. 12 wherein each of the sectors 1–8 has $a$ and $b$ coefficients with the sectors 2 and 3 having the same $a$ and $b$ coefficients $(a_1,b_1)$, the sectors 4 and 5 having the same $a$ and $b$ coefficients $(a_2,b_1)$, the sectors 6 and 7 having the same $a$ and $b$ coefficients $(a_2,b_2)$, and the sectors 1 and 8 having the same $a$ and $b$ coefficients $(a_1,b_2)$.

Figure 13:
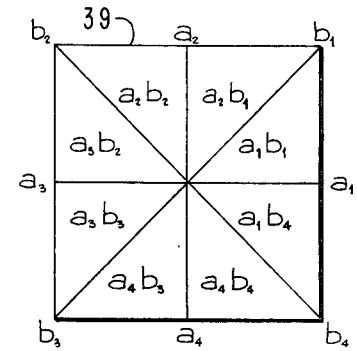
FIG. 13 is a schematic view of the field of FIG. 11 showing the coefficients for each sector of the field for the equation for the stigmator coil currents.

To correct for astigmatism of the beam 11, it is necessary to have a maximum correction at the corners of the field 39 and halfway therebetween. Thus, as shown in FIG. 13, the coefficients $a_1$, $a_2$, $a_3$, and $a_4$ are disposed at each end of the X and Y axes, and the coefficients $b_1$, $b_2$, $b_3$, and $b_4$ are disposed at the corners of the field 39 to satisfy equation (2) for the stigmator coil current for each of the stigmator coils 21A and 21B. Thus, each of the eight sectors of the field 39 has different coefficients for the stigmator coils 21A and 21B.

Figure 2:
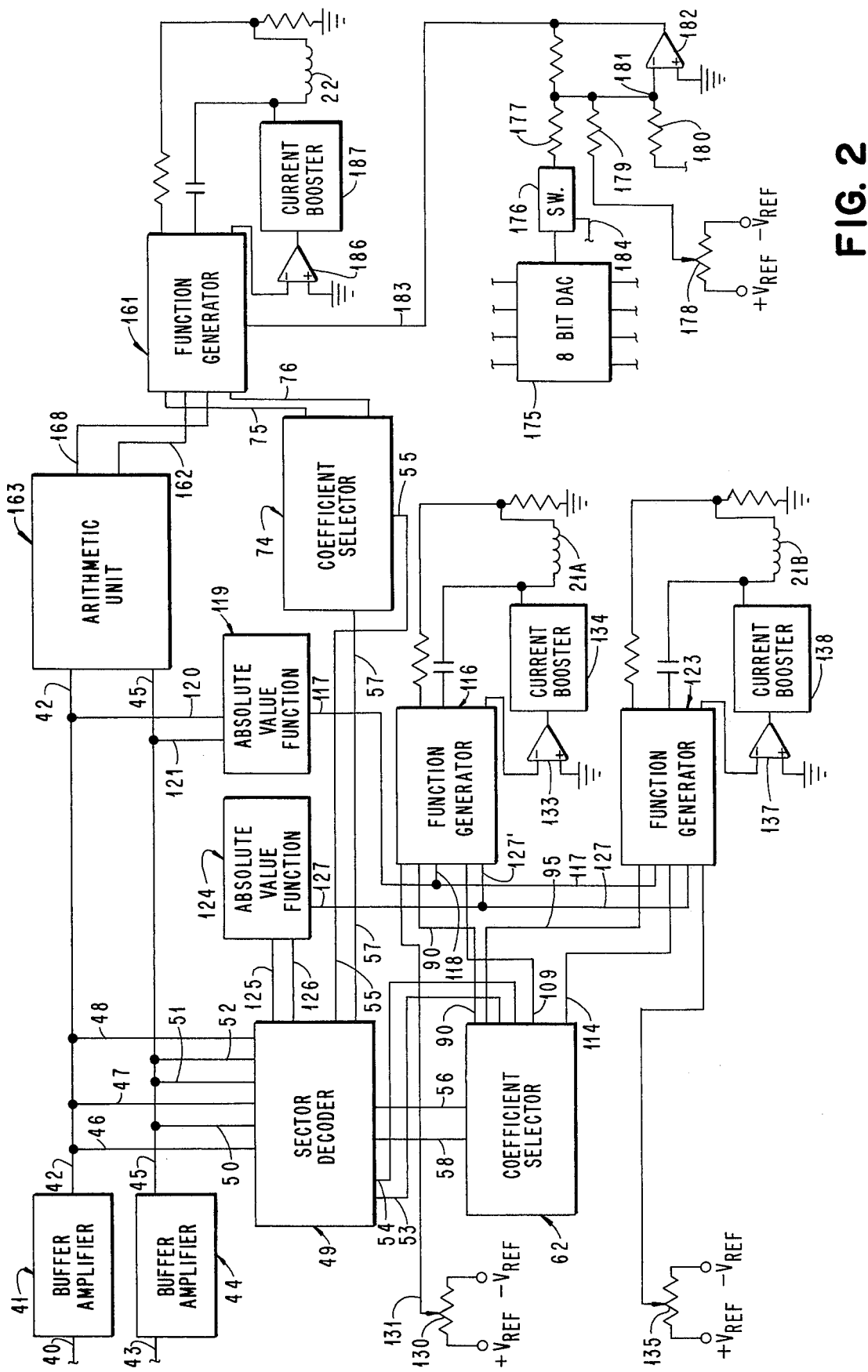
FIG. 2 is a block diagram showing the relationship of circuitry used for generating focus and stigmator coil currents for correcting the focus and astigmatism of the beam in accordance with the location of the beam within its deflection field.

Referring to FIG. 2, there is shown the arrangement for generating the voltage for supplying the focus current to the focus coil 22 in accordance with the location of the beam 11 within the field 39, the voltage for supplying the current for the stigmator coil 21A in accordance with the location of the beam 11 within the field 39, and the voltage for supplying the current for the stigmator coil 21B in accordance with the location of the beam 11 within the field 39. The X magnetic deflection voltage is supplied from the analog unit 17 through a line 40 to a buffer amplifier 41. The X buffer amplifier 41 insures that the voltage on output line 42 of the buffer amplifier 41 has a desired gain.

The Y magnetic deflection voltage from the analog unit 17 is supplied through a line 43 to the buffer amplifier 44. The buffer amplifier 44 controls the gain of the voltage appearing on its output line 45.

The output line 42 of the X buffer amplifier 41 is connected through lines 46, 47, and 48 to a sector decoder 49. The output line 45 of the Y buffer amplifier is connected through lines 50, 51, and 52 to the sector decoder 49.

The sector decoder 49 uses the magnitudes of the X and Y voltages to provide an output signal on each of lines 53, 54, 55, 56, 57, and 58 for selecting the $a$ and $b$ coefficients to determine the current to each of the focus coil 22, the stigmator coil 21A, and the stigmator coil 21B.

Each of the lines 53–58 has either a high or low logic condition to indicate the sector of the field 39 within which the beam 11 is located. These logic signals result in the correct current being supplied to the focus coil 22, the stigmator coil 21A, and the stigmator coil 21B for the specific portion of the beam 11 within the deflected field 39.

The output line 53 of the sector decoder 49 is the output of a comparator 60 (see FIG. 3), which has its input connected to the line 46 to receive the X magnetic deflection voltage. When the X magnetic deflection voltage is positive to indicate that the beam 11 is in one of the sectors 1, 2, 7, or 8 of the field 39 (see FIG. 11), the output of the comparator 60 (see FIG. 3) is high or one. When the X magnetic deflection voltage is negative to indicate that the beam 11 is in one of the sectors 3, 4, 5, and 6 of the field 39 (see FIG. 11), the output of the comparator 60 (see FIG. 3) is low or zero.

The output line 54 of the sector decoder 49 is the output of a comparator 61, which has its input connected to the line 50 to receive the Y magnetic deflection voltage. When the Y magnetic voltage is positive to indicate that the beam 11 is in one of the sectors 1, 2, 3, and 4 of the field 39 (see FIG. 11), the output of the comparator 61 (see FIG. 3) is high or one. When the Y magnetic deflection voltage is negative, the output of the comparator 61 is low or zero. A negative input to the comparator 61 idicates that the beam 11 is in one of the sectors 5, 6, 7, and 8 of the field 39 (see FIG. 11).

Thus, the output lines 53 and 54 (see FIG. 3), which are supplied to a coefficient selector 62 (see FIG. 2), can have both zeros, both ones, or zero on either of the lines and one on the other. Thus, four different logic states or conditions are supplied to the coefficient selector 62 (see FIG. 2) by the lines 53 and 54. The coefficient selector 62 supplies the $a$ and $b$ coefficients for use in equation (2) in generating the current for each of the stigmator coils 21A and 21B.

The sector decoder 49 has a subtractor 63 (see FIg. 3) connected by the line 47 to the output line 42 (see FIG. 2) of the X buffer amplifier 41 and by the line 51 to the output line 45 of the Y buffer amplifier 44. Thus, the X magnetic deflection voltage is supplied to the subtractor 63 (see FIG. 3) through the line 47 and the Y magnetic deflection voltage is supplied to the subtractor 63 by the line 51.

The subtractor 63 produces an output of $-(Y-X)$ on its output line 64. The output line 64 is connected to the input of a comparator 65.

When the output of $-(Y-X)$ is positive, the beam 11 is disposed in one of the sectors 1, 6, 7, and 8 of the field 39 (see FIG. 11). When this occurs, the comparator 65 (see FIG. 3) produces a high or one on its output line 66, which is connected as one input to an EXCLUSIVE OR 67 of the sector decoder 49. If the output of $-(Y-X)$ of the subtractor 63 is negative to indicate that the beam 11 is in one of the sectors 2, 3, 4, and 5 of the field 39 (see FIG. 11), then the comparator 65 (see FIG. 3) has a low or zero output on the output line 66.

An adder 68 is connected by the line 48 to the output line 42 (see FIG. 2) of the X buffer amplifier 41 to receive the X magnetic deflection voltage and by the line 52 to the output line 45 of the Y buffer amplifier 44 to receive the Y magnetic deflection voltage. The adder 68 produces an output of $-(X+Y)$ on its output line 69 (see FIG. 3).

The output line 69 supplies the output of the adder 68 as an input to a comparator 70, which has the output line 56 of the sector decoder 49 connected thereto. The output of the comparator 70 also is connected by a line 71 from the output line 56 as the other input to the EXCLUSIVE OR 67.

When the output of the adder 68 is positive, the beam 11 is in one of the sectors 4, 5, 6, and 7 of the field 39 (see FIG. 11). This positive output from the adder 68 (see FIG. 3) to the input of the comparator 70 produces a high or one on the output line 56 of the comparator 70. When the output of the adder 68 is negative to indicate that the beam 11 is in one of the sectors 1, 2, 3, and 8 of the field 39 (see FIG. 11), the output of the comparator 70 (see FIG. 3) is a low or zero on the output line 56.

Whenever the inputs on the lines 66 and 71 to the EXCLUSIVE OR 67 are the same (That is, either both zeros or both ones), the output line 58 has a high or one. If the inputs on the lines 66 and 71 to the EXCLUSIVE OR 67 are not the same, then the output line 58 has a low or zero thereon.

As a result, the output lines 56 and 58 of the sector decoder 49 supply inputs to the coefficient selector 62 (see FIG. 2) to indicate any of four logic states. That is, either the line 56 or the line 58 can be zero with the other being one, both of the lines 56 and 58 can be zero, or both of the lines 56 and 58 can be one.

The output of the comparator 70 (see FIG. 3) also is supplied through the output line 57, which is connected to the output line 56, to a coefficient selector 74 (see FIG. 2). The coefficient selector 74 also receives an input from the output line 55 of the sector decoder 49. The line 55 is connected to the output line 66 (see FIG. 3) of the comparator 65. The coefficient selector 74 (see FIG. 2) is utilized to provide an output of $a - b$ on an output line 75 and an output of $a + b$ on an output line 76 where $a$ and $b$ are part of equation (1) for determining the focus coil current.

Figure 4:
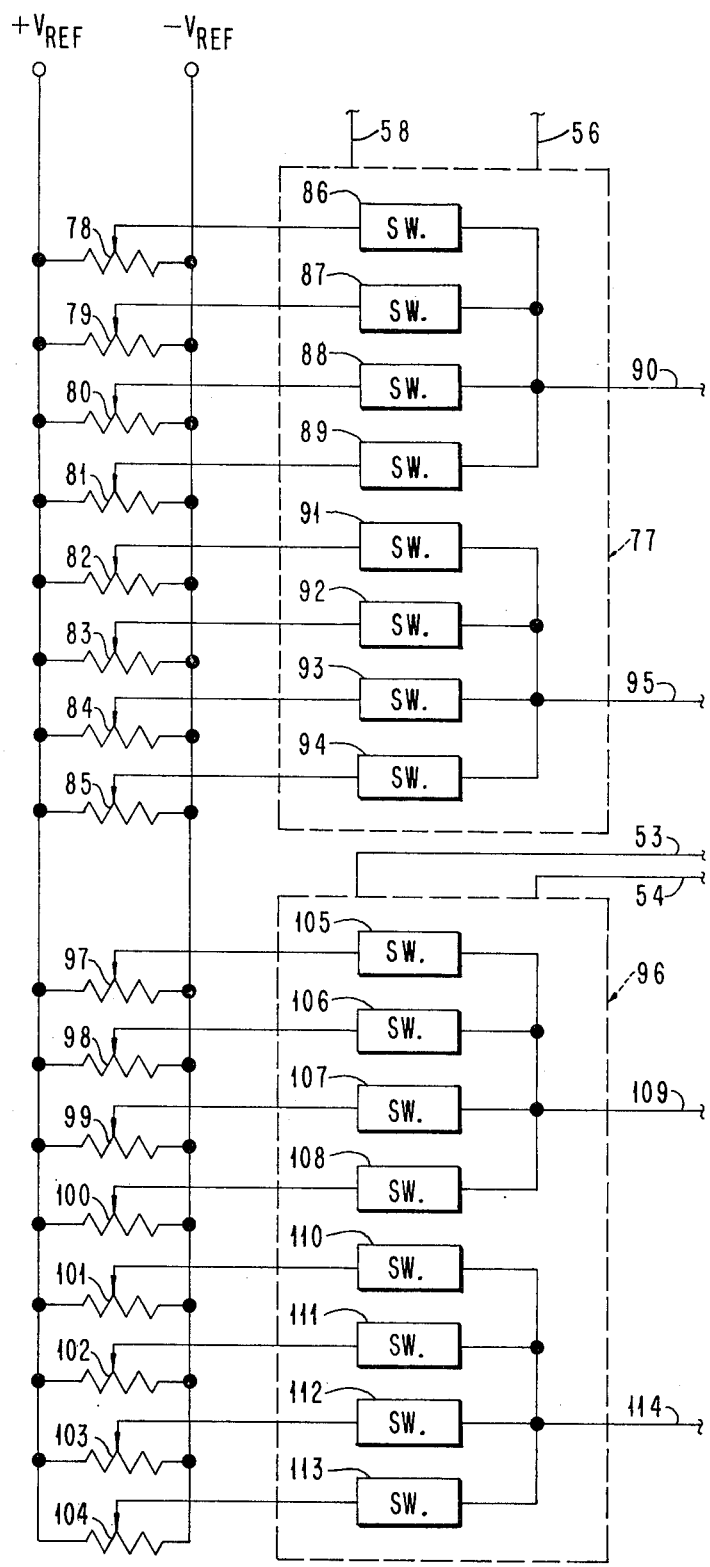
FIG. 4 is a block diagram of a coefficient selector of the circuitry of FIG. 2 used for generating coefficients for the equation for the stigmator coil currents.

As shown in FIG. 4, the coefficient selector 62 has an upper multiplexer 77 to which the output lines 56 and 58 of the sector decoder 49 are connected. The upper multiplexer 77 has eight potentiometers 78, 79, 80, 81, 82, 83, 84, and 85 of the coefficient selector 62 connected thereto.

The potentiometers 78, 79, 80, and 81 are connected through electronic switches 86, 87, 88, and 89, respectively, to an output line 90 of the coefficient selector 62. The potentiometers 82, 83, 84, and 85 are connected through electronic switches 91, 92, 93, and 94, respectively, to an output line 95 of the coefficient selector 62.

Each of the electronic switches 86-89 and 91-94 is preferably an FET. The logic signals on the lines 56 and 58 determine which of the switches 86-89 and 91-94 are closed. A first set of logic conditions on the lines 56 and 58 closes the switches 86 and 91, a second set of logic conditions on the lines 56 and 58 closes the switches 87 and 92, a third set of logic conditions on the lines 56 and 58 closes the switches 88 and 93, and a fourth set of logic conditions on the lines 56 and 58 closes the switches 89 and 94.

Accordingly, only one of the potentiometers 78-81 is connected to the output line 90 at any time, and only one of the potentiometers 82-85 is connected to the output line 95 at any one time. The output line 90 supplies the $a$ coefficient of equation (2) for the stigmator coil 21A. The output line 95 supplies the $a$ coefficient of equation (2) for the stigmator coil 21B. The resistance of each of the potentiometers 78-85 is set to insure that each of the coefficients is correct for each of the stigmator coils 21A and 21B in accordance with the location of the beam 11 within the field 39 (see FIG. 11).

The lines 53 and 54 of the sector decoder 49 are connected to a lower multiplexer 96 (see FIG. 4). The lower multiplexer 96 has potentiometers 97, 98, 99, 100, 101, 102, 103, and 104 connected thereto. The potentiometers 97, 98, 99, and 100 are connected through electronic switches 105, 106, 107, and 108, respectively, within the lower multiplexer 96 to an output line 109 of the coefficient selector 62. Only one of the switches 105-108 is closed at any time to allow the potentiometer to be connected to the output line 109 of the coefficient selector 62 to supply the $b$ coefficient in equation (2) for the stigmator coil 21A.

The potentiometers 101, 102, 103, and 104 are connected through electronic switches 110, 111, 112, and 113, respectively, to an output line 114 of the coefficient selector 62. Only one of the switches 110-113 is closed at any one time to allow one of the potentiometers 101-104 to be connected to the output line 114 to supply the $b$ coefficient in equation (2) for the stigmator coil 21B.

Each of the electronic switches 105-108 and 110-113 is preferably an FET. When the lines 53 and 54 are in one logic condition, the switches 105 and 110 are closed. When the lines 53 and 54 have a second logic condition, the switches 106 and 111 are closed. The switches 107 and 112 are closed when the lines 53 and 54 have a third logic state. The switches 108 and 113 are closed when the lines 53 and 54 are in their fourth logic state.

Accordingly, only one of the potentiometers 97-100 is connected to the output line 109 at any time, and only one of the potentiometers 101-104 is connected to the output line 114 at any one time. The output line 109 supplies the $b$ coefficient of equation (2) for the stigmator coil 21A. The output line 114 supplies the $b$ coefficient of equation (2) for the stigmator coil 21B. The resistance of each of the potentiometers 97-104 is set to insure that each of the $b$ coefficients is correct for each of the stigmator coils 21A and 21B in accordance with the location of the beam 11 within the field 39 (see FIG. 11).

Thus, each of the $a$ coefficients and each of the $b$ coefficients for the stigmator coils 21A and 21B are produced in accordance with the sector of the field 39 (see FIG. 11) within which the beam 11 is located. That is, if the beam 11 is in sector 1 of the field 39, for example, than the outputs of the comparators 60 and 61 (see FIG. 3) will be high or one so that the lines 53 and 54 will supply ones to the lower multiplexer 96 (see FIG. 4). When the beam 11 is moved to sector 2 of the field 39 (see FIG. 11), for example, there would be no change in the outputs of the comparators 60 and 61 (see FIG. 3) so that the b coefficients on the ouput lines 109 and 114 (see FIG. 4) of the coefficient selector 62 remain the same.

However, the a coefficients on the output lines 90 and 95 of the coefficient selector 62 will change when the beam 11 is moved from sector 1 of the field 39 to sector 2 of the field. In sector 1 of the field 39, the output of the comparator 65 is one since $-(Y-X)$ is positive because X is greater than Y. The output of the comparator 70 is zero since its input of $-(X+Y)$ is negative. Thus, with two different logic conditions (one and zero) as the inputs to the EXCLUSIVE OR 67, the output of the EXCLUSIVE OR 67 is zero. Accordingly, when the beam 11 is in sector 1 of the field 39, the output line 56 of the comparator 70 has zero and the output line 58 of the EXCLUSIVE OR 67 has zero.

In sector 2 of the field 39, the output of the comparator 65 is zero since its input of $-(Y-X)$ is negative because Y exceeds X. The output of the comparator 70 is still zero since its input of $-(X+Y)$ remains negative. Therefore, there are two zero inputs to the EXCLUSIVE OR 67 so that its output is one. Thus, in sector 2 of the field 39, the logic condition on the line 58 is opposite to that in sector 1 of the field 39. As a result, the a coefficients on each of the output lines 90 and 95 of the coefficient selector 62 are changed since a different two of the electronic switches 86–89 and 91–94 are closed.

The output line 90 of the upper multiplexer 77 of the coefficient selector 62 is connected as one input to a multiplier 115 (see FIG. 5) of a function generator 116. The other input to the multiplier 115 is from an output line 117, which is connected by a line 118 to the multiplier 115, of an absolute value function circuit 119 (see FIG. 2), which has its input line 120 connected to the output line 42 of the X buffer amplifier 41 and its input line 121 connected to the output line 45 of the Y buffer amplifier 44.

Figure 10:
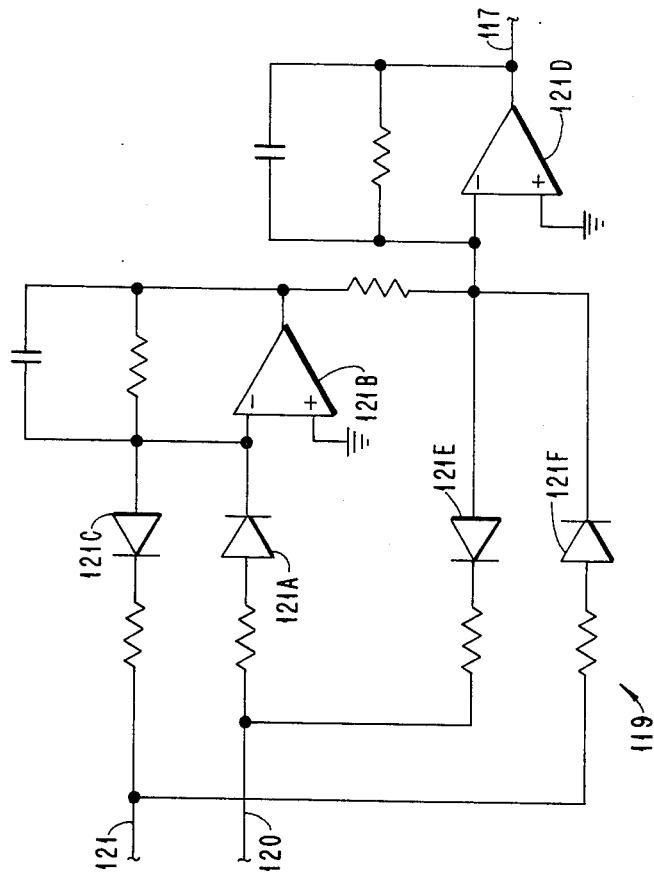
FIG. 10 is a wiring diagram of an absolute value function circuit of the circuitry of FIG. 2.

As shown in FIG. 10, the input line 120 of the absolute value function circuit 119 is connected through a forward biased diode 121A to the negative input of a differential amplifier 121B. The input line 121 is connected to the negative input of the differential amplifier 121B through a backward biased diode 121C. Thus, the diode 121A will pass only +X magnetic deflection voltages to the negative input of the differential amplifier 121B while the diode 121C will pass only $-Y$ magnetic voltages to the negative input of the differential amplifier 121B.

The output of the differential amplifier 121B is connected to the negative input of a differential amplifier 121D. The negative input of the differential amplifier 121D also has the X input line 120 connected thereto through a backward biased diode 121E and the Y input line 121 connected thereto through a forward biased diode 121F. Thus, the diode 121E will pass only $-X$ magnetic deflection voltages to the negative input of the differential amplifier 121D while the diode 121F will pass only $+Y$ magnetic deflection voltages to the negative input of the differential amplifier 121D.

Any X output of the differential amplifier 121D will be positive, irrespective of the X input to the absolute value function circuit 119, and any Y input will be negative irrespective of the Y input to the absolute value function circuit 119. This is shown by the following table:

| X | Y | OUTPUT OF DIFFERENTIAL AMPLIFIER 121B | OUTPUT OF DIFFERENTIAL AMPLIFIER 121D |
|---|---|---|---|
| 0 | 0 | 0 | 0 |
| 0 | + | 0 | $-Y$ |
| 0 | $-$ | $+Y$ | $-$ |
| + | 0 | $-X$ | $+X$ |
| + | + | $-X$ | $X-Y$ |
| + | $-$ | $-X+Y$ | $X-Y$ |
| $-$ | 0 | 0 | $+X$ |
| $-$ | + | 0 | $X-Y$ |
| $-$ | $-$ | $+Y$ | $X-Y$. |

Thus, the absolute value function circuit 119 produces an output on the line 117 of $|X| - |Y|$. Accordingly, the absolute value function circuit 119 produces an output, which is modified by the coefficient a in the multiplier 115 (see FIG. 5), to produce one of the terms of equation (2) to determine the stigmator coil current for the stigmator coil 21A.

The line 117 also is connected to a multiplier 122 (see FIG. 6) in a function generator 123, which produces an output voltage that supplies the current for the stigmator coil 21B to supply an input to the multiplier 122. The other input to the multiplier 122 is the a coefficient from the output line 95 of the coefficient selector 62. Thus, the multiplier 122 provides an output of the first term of equation (2) to determine the stigmator coil current for the stigmator coil 21B.

A second absolute value function circuit 124 (see FIG. 2) is connected by an input line 125 to the output line 69 (see FIg. 3) of the adder 68 and by an input line 126 to the output line 64 of the subtractor 63. The output voltage of the absolute value function circuit 124 is connected by its output line 127 and a line 127' as an input to a multiplier 128 (see FIG. 5) in the function generator 116 and by the line 127 as an input to a multiplier 129 (see FIG. 6) in the function generator 123.

The absolute value function circuit 124 is the same as the absolute value function circuit 119 except that the line 125 replaces the line 120, the line 126 replaces the line 121, and the line 127 replaces the line 117 in FIG. 10. Thus, the absolute value function circuit 124 produces an output of $|X+Y| - |Y-X|$ since the input line 125 has $-(X+Y)$ thereon and the line 126 has $-(Y-X)$ thereon.

The other input to the multiplier 128 (see FIG. 5) of the function generator 116 is the coefficient b on the output line 109 of the lower multiplexer 96 of the coefficient selector 62. Thus, the output of the multiplier 128 is the second term in equation (2) for determining the stigmator coil current for the stigmator coil 21A.

The other input to the multiplier 129 (see FIG. 6) of the function generator 123 is the output line 114 of the lower multiplexer 96 of the coefficient selector 62. This supplies the b coefficient to the multiplier 129. The output of the multiplier 129 is the second term in equation (2) for determining the stigmator coil current for the stigmator coil 21B.

The third term of equation (2) for determining the stigmator coil current is the constant k. The function generator 116 (see FIG. 5) has a potentiometer 130 connected through a line 131 to supply the constant $k$ of equation (2) for the stigmator coil 21A.

The function generator 116 has the output of the potentiometer 130, the multiplier 115, and the multiplier 128 summed at a summing point 132, which is connected to the negative input of a differential amplifier 133 (see FIG. 2) of the coil driver for the stigmator coil 21A. The output of the differential amplifier 133 is supplied through a current booster 134, which has unity gain, to the stigmator coil 21A as shown in FIG. 2.

The constant $k$ of equation (2) for the stigmator coil 21B is supplied from a potentiometer 135 (see FIG. 6) to the function generator 123. The output of the potentiometer 135, the output of the multiplier 122, and the output of the multiplier 129 are summed at a summing point 136 and supplied to the negative input of a differential amplifier 137 (see FIG. 2) of the coil driver for the stigmator coil 21B. The output of the differential amplifier 137 is supplied through a current booster 138, which has a unity gain, to the stigmator coil 21B as shown in FIG. 2.

Figure 7:
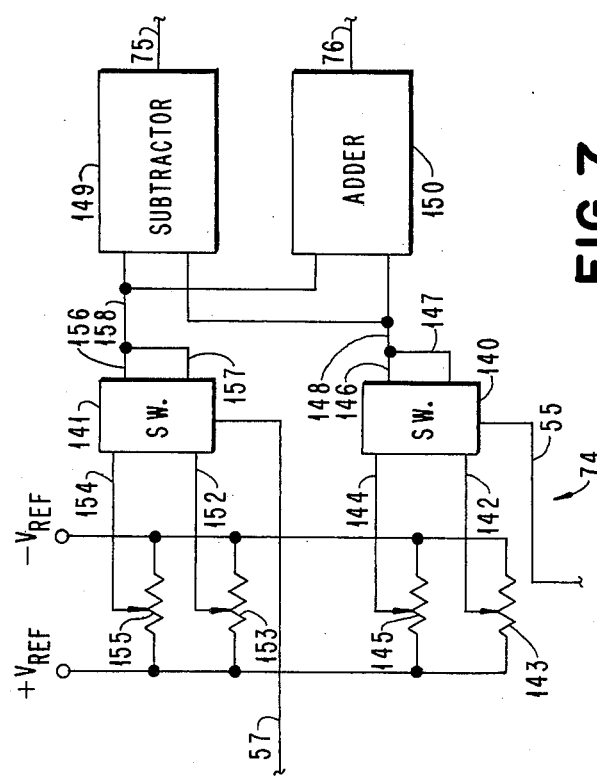
FIG. 7 is a block diagram of a coefficient selector of the circuitry of FIG. 2 used in generating coefficients for the equation for the focus coil current.

As previously mentioned, the coefficient selector 74 (see FIG. 7) has the lines 55 and 57 connected thereto with the line 55 supplying the output of the comparator 65 (see FIG. 3) and the line 57 supplying the output of the comparator 70. The line 55 is connected to an electronic switch 140 (see FIG. 7), and the line 57 is connected to an electronic switch 141. One suitable example of the electronic switches 140 and 141 is sold by Dickson Electronics Corporation as model DAS2126.

The switch 140 has an input line 142 connected to a potentiometer 143 and an input line 144 connected to a potentiometer 145. When the output of the comparator 65 (see FIG. 3) is high or one, the potentiometer 145 (see FIG. 7) is connected to output line 146 of the switch 140. When the output of the comparator 65 is low or zero, the potentiometer 143 is connected to output line 147 of the switch 140. A single output line 148 is connected to both of the output lines 146 and 147 to supply the output of the potentiometer 145 or 143 as an input to both a subtractor 149 and an adder 150 of the coefficient selector 74.

The output on the line 148 is the coefficient $b$ of equation (1). When the potentiometer 145 is connected to the output line 148, the coefficient $b_2$ is supplied since the input to the comparator 65 (see FIG. 3) of $-(Y-X)$ is positive and indicates that the beam is in one of the sectors 1, 6, 7, and 8 of the field 39 (see FIG. 11). When the potentiometer 143 (see FIG. 7) is connected to the output line 148, the coefficient $b_1$ is supplied. This is because the input of $-(Y-X)$ to the comparator 65 (see FIG. 3) is negative so that the beam 11 is one of sectors 2, 3, 4, and 5 of the field 39 (see FIG. 11).

The switch 141 (see FIG. 7) has an input line 152 connected to a potentiometer 153 and an input line 154 connected to a potentiometer 155. When the output of the comparator 70 (see FIG. 3) is high or one, the potentiometer 155 (see FIG. 7) is connected to an output line 156 of the switch 141. When the output of the comparator 70 (see FIG. 3) is low or zero, the potentiometer 153 (see FIG. 7) is connected to an output line 157 of the switch 141. A single output line 158 is connected to both of the output lines 156 and 157 to supply the output of the potentiometer 155 or 153 as an input to both the subtractor 149 and the adder 150 of the coefficient selector 74.

The output on the line 158 is the coefficient $a$ of equation (1). When the output of the comparator 70 (see FIG. 3) is high or one due to its input of $-(X-Y)$ being positive, the output line 158 (see FIG. 7) has the coefficient $a_2$. This indicates that the beam 11 is in one of sectors 4, 5, 6, and 7 of the field 39 (see FIG. 11).

When the output of the comparator 70 (see FIG. 3) is low or zero due to its input of $-(X+Y)$ being negative, the output on the line 158 (see FIG. 7) is the coefficient $a_1$ from the potentiometer 153. When the output of the comparator 70 (see FIG. 3) is low or zero, this indicates that the beam 11 is in one of sectors 1, 2, 3, and 8 of the field 39 (see FIG. 11).

Thus, each of the $a$ and $b$ coefficients for equation (1) for the focus coil 22 is produced in accordance with the sector of the field 39 within which the beam 11 is located. That is, if the beam 11 is in sector 1 of the field 39, for example, then the output of the comparator 65 (see FIG. 3) will be high or one so that the output of the switch 140 (see FIG. 7) is the coefficient $b_2$ and the output of the comparator 70 (see FIG. 3) will be low or zero so that the output of the switch 141 (see FIG. 3) is the coefficient $a_1$.

When the beam 11 is moved to sector 2 of the field 39 (see FIG. 11), for example, there would be no change in the ouput of the comparator 70 (see FIG. 3) so that the $a$ coefficient will remain the same (that is, $a_1$). However, the output of the comparator 65 changes state so that a low or zero is supplied to the switch 140 (see FIG. 7). This results in the output of the switch 140 being the coefficient $b_1$.

Figure 8:
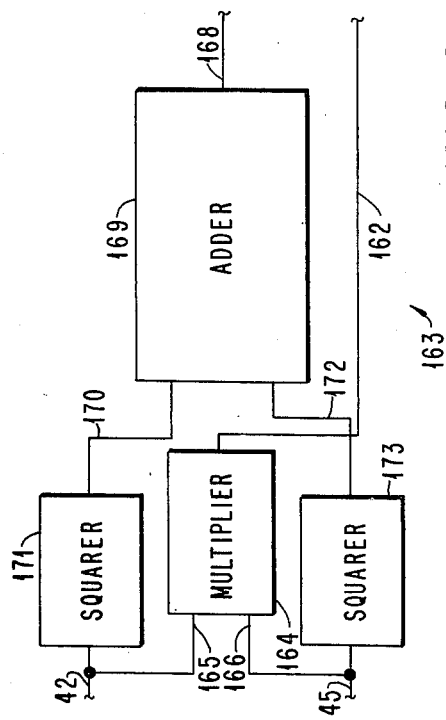
FIG. 8 is a block diagram of an arithmetic unit of the circuitry of FIG. 2.
Figure 9:
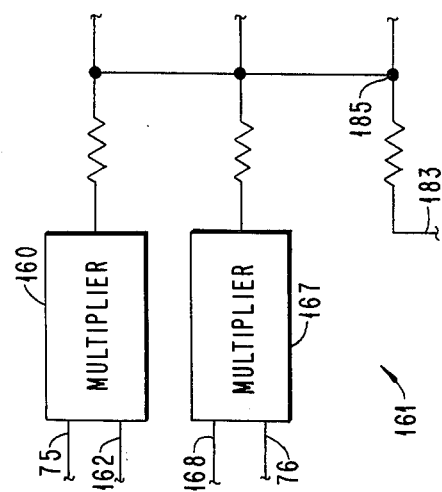
FIG. 9 is a block diagram of a function generator of the circuitry of FIG. 2 for generating the voltage to produce the current for the focus coil.

The output line 75 from the subtractor 149 is connected as one input to a multiplier 160 (see FIG. 9) of a function generator 161. The other input to the multiplier 160 is from an output line 162 of an arithmetic unit 163 (see FIG. 3). The output line 162 of the arithmetic unit 163 is connected to a multiplier 164 (see FIG. 8), which has its input line 165 connected to the output line 42 (see FIG. 2) of the X buffer amplifier 41 and its input line 166 (see FIG. 8) connected to the output line 45 (see FIG. 2) of the Y buffer amplifier 44.

Thus, the multiplier 164 (see FIG. 8) produces an output of XY. This is multiplied in the multiplier 160 (see FIG. 9) by $a - b$ from the subtractor 149 of the coefficient selector 74 to produce one of the terms of equation (1) for determining the focus coil current for the focus coil 22.

The output line 76 of the adder 150 (see FIG. 7) of the coefficient selector 74 is connected as one input to a multiplier 167 (see FIG. 9) of the function generator 161. The other input to the multiplier 167 is from an output line 168 of the arithmetic unit 163.

The output line 168 of the arithmetic unit 163 is connected to an adder 169 (see FIG. 8), which has its input line 170 connected to a squarer 171 and its input line 172 connected to a squarer 173. The squarer 171 is connected to the output line 42 of the X buffer amplifier 41 so that the output of the squarer 171 is $X^2$. The squarer 173 is connected to the output line 45 of the Y buffer amplifier 44 so that the output of the squarer 173 is $Y^2$. Accordingly, the output of the adder 169 on the output line 168 is $X^2 + Y^2$.

Thus, the multiplier 167 produces the output of $(a + b)(X^2 + Y^2)$. This is another of the terms of equation (1) for determining the focus coil current of the focus coil 22.

The third term of equation (1) for determining the focus coil current is the constant $k$. One of the components of the constant $k$ is the wafer thickness, and this is supplied from an eight bit digital to analog converter (DAC) 175 (see FIG. 2) through an electronic switch 176, which is preferably the same as the switches 140 and 141, to a resistor 177. Another portion of the constant $k$ is the center focus correction for the focus coil 22 and is supplied from a potentiometer 178 through a resistor 179.

The third component of the constant $k$ is the output from the focus servo as more particularly shown and described in our aforesaid application. The output of the focus servo is set during certain C cycles and is supplied through a resistor 180.

The constant $k$ has its components summed at a summing point 181 and supplied to the negative input of a differential amplifier 182. The output of the differential amplifier 182 is supplied by a line 183 to the function generator 161.

It should be understood that the switch 176 is disconnected from the eight bit DAC 175 whenever there is activation of the manual switch in our aforesaid application to manually adjust the quality of the focus of the beam 11. When this occurs, the signal supplied over a line 184 to the switch 176 disconnects the eight bit DAC 175 from the resistor 177 and grounds the resistor 177.

The function generator 161 has the output of the multiplier 160, the multiplier 167, and the differential amplifier 182 summed at a summing point 185 (see FIG. 9), which is connected to the negative input of a differential amplifier 186 (see FIG. 2) of the coil driver for the focus coil 22. The output of the differential amplifier 186 is supplied though a current booster 187, which has unity gain, to the focus coil 22.

Considering the operation of the present invention, the current to the focus coil 22 and the current to each of the stigmator coils 21A and 21B is continuously adjusted depending upon the location of the beam 11 within the deflection field 39. The location of the beam 11 is determined by which of the eight sectors 1-8 of the field 39 that the beam 11 is disposed. The relationship between the outputs of the comparators 60, 61, 65, and 67, and the EXCLUSIVE OR 70 with respect to sectors 1-8 of the field 39, the coefficients $a_1$, $a_2$, $a_3$, and $a_4$ and $b_1$, $b_2$, $b_3$, and $b_4$ used as the $a$ and $b$ coefficients in equation (2) for each of the stigmator coils 21A and 21B in accordance with the location of the beam 11 in sectors 1-8 of the field 39, and the coefficients $a_1$, $a_2$ and $b_1$, $b_2$ used as the $a$ and $b$ coefficients in equation (1) for the focus coil 22 in accordance with the location of the beam 11 in sectors 1-8 of the field 39 are shown in the following table:

equation (2) for determining the current to each of the stigmator coils 21A and 21B.

It should be understood that each of the coefficients such as the coefficient $a_1$, for example, is different for each of the stigmator coils 21A and 21B since each of the two coefficients $a_1$ is represented by two different potentiometers of the potentiometers 78-85. Likewise, each of the $b$ coefficients such as $b_1$, for example, is different for the stigmator coils 21A and 21B since each of the two coefficients $b_1$ is represented by two different potentiometers of the potentiometers 97-104. However, each of the $a_1$ or $b_1$ coefficients, for example, is selected simultaneously.

The output of the comparator 70 determines which of the coefficients $a_1$ and $a_2$ is used in equation (1) for determining the current to the focus coil 22. The output of the comparator 65 determines which of the coefficients $b_1$ or $b_2$ is used in equation (1) in determining the current for the focus coil 22.

Whenever the $a$ coefficient of equation (1) for determining the current to the focus coil 22 is to be changed, the sum X and Y becomes zero. This insures continuity of the focus coil current since there is only a very small step as the product nears zero.

Since equation (1) also can be written as $$i_f = a(X+Y)^2 + b(X-Y)^2 + k,$$

the sum of X + Y should be zero when the coefficient $a$ changes. Referring to FIG. 12 in which the field 39 is divided into eight sectors with the coefficients $a_1$, $a_2$, $b_1$, and $b_2$, X + Y = 0 along the diagonal line extending from the corners $b_1$ to $b_2$ of the field 39. It is along this line that the coefficient $a$ is changed between $a_1$ and $a_2$.

Similarly, when X and Y are equal, the product of $(X-Y)^2$ with the $b$ coefficient becomes zero. Since X and Y are equal so that their difference is zero along the diagonal line extending from the corners $a_1$ to $a_2$, this is when the coefficient $b$ changes between $b_1$ and $b_2$ depending on which direction the beam 11 is moving at that time.

The coefficients $a$ and $b$ in equation (2) for determining the current for each of the stigmator coils 21A and 21B are changed when the product of voltage and the coefficient is at zero. As shown in equation (2), the coefficient $a$ is multiplied by $|X| - |Y|$. Thus, any time that the absolute values of X and Y are equal, the coefficient $a$ should be changed.

As shown in FIG. 13, the coefficient $a$ for equation (2) is changed each time that the absolute values of the X and Y magnetic voltages are equal since they are

| SECTOR | COMPARATORS 60 61 65 70 | EXCLUSIVE OR 67 | STIGMATOR COILS 21A AND 21B | FOCUS COIL 22 |
|---|---|---|---|---|
| 1 | 1 1 1 0 | 0 | $a_1 b_1$ | $a_1 b_2$ |
| 2 | 1 1 0 0 | 1 | $a_2 b_1$ | $a_1 b_1$ |
| 3 | 0 1 0 0 | 1 | $a_2 b_2$ | $a_1 b_1$ |
| 4 | 0 1 0 1 | 0 | $a_3 b_2$ | $a_2 b_1$ |
| 5 | 0 0 0 1 | 0 | $a_3 b_3$ | $a_2 b_1$ |
| 6 | 0 0 1 1 | 1 | $a_4 b_3$ | $a_2 b_2$ |
| 7 | 1 0 1 1 | 1 | $a_4 b_4$ | $a_2 b_2$ |
| 8 | 1 0 1 0 | 0 | $a_1 b_4$ | $a_1 b_2$ |

The outputs of the comparators 60 and 61 determine which of the coefficients $b_1$, $b_2$, $b_3$, and $b_4$ is used in equation (2) for determining the current to each of the stigmator coils 21A and 21B. The outputs of the EXCLUSIVE OR 67 and the comparator 70 determine which of the coefficients $a_1$, $a_2$, $a_3$, and $a_4$ is used in equal along the diagonal lines extending from the corners $b_1$ to $b_3$ and the corners $b_2$ to $b_4$. Thus, FIG. 13 shows this coefficient change occurring, for example, when the beam 11 is moved between sectors 1 and 2 of the deflection field 39.

The $b$ coefficient for equation (2) for determining the stigmator coil current for each of the stigmator coils 21A and 21B should be changed when $(|X + Y| - |Y - X|)$ is zero. This term can become zero when either X or Y is zero. This occurs along the X axis, which is defined by a line extending between $a_1$ and $a_3$, and the Y axis, which is defined by a line extending between $a_2$ and $a_4$.

As shown in FIG. 13, the coefficient $b$ changes whenever the beam 11 crosses either the X axis or the Y axis. For example, when the beam 11 crosses the Y axis above the X axis in moving between the sectors 2 and 3 of the field 39, the coefficient $b$ changes.

While the present invention has shown and described the field 39 as being square shaped, it should be understood that such is not a requirement for the method and system of the present invention to work. If the field 39 were to be other than square shaped, the coefficients would be selected through utilizing a square-shaped field and then reducing the size of the field to that actually employed. For example, the field 39 could be a rectangle or circle.

While the present invention has shown and described the correction of both focus and astigmatism of the beam 11, it should be understood that such is not absolutely necessary for this invention to have utility. Thus, it might be desired to correct only focus or astigmatism. For example, if the target were curved in accordance with the focal length of the focus at any position in the field 39 to which the beam 11 is deflected, then it would only be necessary to correct for astigmatism. If only correction for focus were being made where the astigmatism could be ignored since the beam 11 would not need to have the resolution produced by removing the astigmatism, the field 39 could be reduced to four sectors rather than eight. Thus, the lines along the X and Y axes in the field 39 could be removed.

An advantage of this invention is that correction of the focus of a beam of charged particles is dynamically and automatically made whenever the beam is deflected from the center of its deflection field. Another advantage of this invention is that astigmatism of the beam also is dynamically and automatically corrected whenever the beam is deflected from the center of its deflection field. A further advantage of this invention is that correction for focus and astigmatism of the beam of charged particles is dynamically and automatically made without any discontinuity in the correction thereof. Still another advantage of this invention is that the adjustable coefficients can be adjusted one at a time and each coefficient is independent of the other coefficients in the same function.

While the invention has been particularly shown and described with reference to a preferred embodiment thereof, it will be understood by those skilled in the art that various changes in form and details may be made therein without departing from the spirit and scope of the invention.

What is claimed is:

1. A system for automatically correcting the aberration of a beam of charged particles as the beam moves from the center of a deflection field including:
    means to move the beam to any position within the field;
    means to determine any of the locations of the beam within the field to which the beam is moved by said moving means;
    said determining means including means to ascertain which sector of a plurality of sectors of the field that the beam is located with each of the sectors being defined by lines passing through the center of the field;
    and means to correct the aberration of the beam in accordance with the location of the beam in the field relative to the center of the field so that the beam has no aberration at its location in the field.

2. The system according to claim 1 in which said correction means includes means to generate at least one voltage to correct the aberration of the beam in accordance with the sector in which the beam is disposed and the beam's location within the sector.

3. The system according to claim 2 in which:
    said moving means includes means to produce orthogonal deflection voltages to deflect the beam to each of its locations in the field;
    and said ascertaining means includes:
        means to receive the orthogonal deflection voltages that deflect the beam to its location in the field;
        and means to process signals relating to the orthogonal deflection voltages received by said receiving means to locate the sector of the field in which the beam is located.

4. The system according to claim 3 in which said signal processing means including means to supply signals to said voltage generating means to cause said voltage generating means to generate the voltage in accordance with the signals from said signal processing means.

5. The system according to claim 4 in which:
    the aberration is the beam not being focused on a substantially flat target when the beam is not located at the center of the field;
    said signal supply means of said signal processing means includes means to produce a pair of coefficients with each of the coefficients being determined by the sector of the field in which the beam is located;
    said voltage generating means includes:
        first means to multiply a first value related to at least one of the pair of coefficients and a first voltage related to both of the orthogonal deflection voltages to produce a first portion of the generated voltage;
        and second means to multiply a second value related to at least the other of the pair of coefficients and a second voltage, different from the first voltage and related to both of the orthogonal deflection voltages, to produce a second portion of the generated voltage;
    and means to supply the generated voltage to focus means for the beam to change the focal length so that the beam is focused on the flat target at the location of the beam in the field.

6. The system according to claim 5 including means to change the value of each of the coefficients from said coefficient producing means when the voltage, multiplied by the value of the coefficient in said corresponding multiplying means, is at zero.

7. The system according to claim 4 in which:
    the aberration includes the beam having an astigmatism when the beam is not located in the center of the field;
    said signal supply means of said signal processing means includes means to produce first and second pairs of coefficients with each of the coefficients of each of the pairs being determined by the sector of the field in which the beam is located;

said voltage generating means includes:

first means to multiply a first value related to one of the first pair of coefficients and a first voltage related to both of the orthogonal deflection voltages to produce a portion of a first generated voltage;

second means to multiply a second value related to the other of the first pair of coefficients and a second voltage, different from the first voltage and related to both of the orthogonal deflection voltages, to produce another portion of the first generated voltage;

third means to multiply a third value related to one of the second pair of coefficients and a third voltage related to both of the orthogonal deflection voltages to produce a portion of a second generated voltage;

and fourth means to multiply a fourth value related to the other of the second pair of coefficients and a fourth voltage, different from the third voltage and related to both of the orthogonal deflection voltages, to produce another portion of the second generated voltage;

first supply means to supply the first generated voltage to first stigmator means to correct the astigmatism of the beam in one direction;

and second supply means to supply the second generated voltage to second stigmator means to correct the astigmatism of the beam in a direction orthogonal to the one direction.

8. The system according to claim 7 including means to change the value of each of the coefficients from said coefficient producing means when the voltage, multiplied by the value of the coefficient in said corresponding multiplying means, is at zero.

9. The system according to claim 4 in which:

the aberration includes the beam having an astigmatism when the beam is not located in the center of the field;

said signal supply means of said signal processing means includes means to produce first and second pairs of coefficients with each of the coefficients of each of the pairs being determined by the sector of the field in which the beam is located;

said voltage generating means includes:

first means to multiply a first value related to at least one of the first pair of coefficients and a first voltage related to both of the orthogonal deflection voltages to produce a portion of a first generated voltage;

second means to multiply a second value related to at least the other of the first pair of coefficients and a second voltage, different from the first voltage and related to both of the orthogonal deflection voltages, to produce another portion of the first generated voltage;

third means to multiply a third value related to at least one of the second pair of coefficients and a third voltage related to both of the orthogonal deflection voltages to produce a portion of a second generated voltage;

and fourth means to multiply a fourth value related to at least the other of the second pair of coefficients and a fourth voltage, different from the third voltage and related to both of the orthogonal deflection voltages, to produce another portion of the second generated voltage;

first supply means to supply the first generated voltage to first stigmator means to correct the astigmatism of the beam in one direction;

and second supply means to supply the second generated voltage to second stigmator means to correct the astigmatism of the beam in a direction orthogonal to the one direction.

10. The system according to claim 4 in which:

the aberration includes the beam not being focused on a substantially flat target when the beam is not located at the center of the field and the beam having an astigmatism when the beam is not located at the center of the field;

said signal supply means of said signal processing means includes means to produce first, second, and third pairs of coefficients with each of the coefficients of each of the pairs being determined by the sector of the field in which the beam is located;

said voltage generating means includes:

first means to multiply a first value related to at least one cf the first pair of coefficients and a first voltage related to both of the orthogonal deflection voltages to produce a portion of a first generated voltage;

second means to multiply a second value related to at least the other of the first pair of coefficients and a second voltage, different from the first voltage and related to both of the orthogonal deflection voltages, to produce another portion of the first generated voltage;

third means to multiply a third value related to one of the second pair of coefficients and a third voltage related to both of the orthogonal deflection voltages to produce a portion of a second generated voltage;

fourth means to multiply a fourth value related to the other of the second pair of coefficients and a fourth voltage, different from the third voltage and related to both of the orthogonal deflection voltages, to produce another portion of the second generated voltage;

fifth means to multiply a fifth value related to one of the third pair of coefficients and a fifth voltage related to both of the orthogonal deflection voltages to produce a portion of a third generated voltage;

and sixth means to multiply a sixth value related to the other of the third pair of coefficients and a sixth voltage, different from the fifth voltage and related to both of the orthogonal deflection voltages, to produce another portion of the third generated voltage;

first supply means to supply the first generated voltage to focus means for the beam to change the focal length so that the beam is focused on the flat target at the location of the beam in the field;

second supply means to supply the second generated voltage to first stigmator means to correct the astigmatism of the beam in one direction;

and third supply means to supply the third generated voltage to second stigmator means to correct the astigmatism of the beam in a direction orthogonal to the one direction.

11. The system according to claim 10 including means to change the value of each of the coefficients from said coefficient producing means when the voltage, multiplied by the value of the coefficient in said corresponding multiplying means, is at zero.

12. The system according to claim 4 in which:
the aberration includes the beam not being focused on a substantially flat target when the beam is not located at the center of the field and the beam having an astigmatism when the beam is not located at the center of the field;
said signal supply means of said signal processing means includes means to produce first, second, and third pairs of coefficients with each of the coefficients of each of the pairs being determined by the sector of the field in which the beam is located;
said voltage generating means includes:
first means to multiply a first value related to at least one of the first pair of coefficients and a first voltage related to both of the orthogonal deflection voltages to produce a portion of a first generated voltage;
second means to multiply a second value related to at least the other of the first pair of coefficients and a second voltage, different from the first voltage and related to both of the orthogonal deflection voltages, to produce another portion of the first generated voltage;
third means to multiply a third value related to at least one of the second pair of coefficients and a third voltage related to both of the orthogonal deflection voltages to produce a portion of a second generated voltage;
fourth means to multiply a fourth value related to at least the other of the second pair of coefficients and a fourth voltage, different from the third voltage and related to both of the orthogonal deflection voltages, to produce another portion of the second generated voltage;
fifth means to multiply a fifth value related to at least one of the third pair of coefficients and a fifth voltage related to both of the orthogonal deflection voltages to produce a portion of a third generated voltage;
and sixth means to multiply a sixth value related to at least the other of the third pair of coefficients and a sixth voltage, different from the fifth voltage and related to both of the orthogonal deflection voltages, to produce another portion of the third generated voltage;
first supply means to supply the first generated voltage to focus means for the beam to change the focal length so that the beam is focused on the flat target at the location of the beam in the field;
second supply means to supply the second generated voltage to first stigmator means to correct the astigmatism of the beam in one direction;
and third supply means to supply the third generated voltage to second stigmator means to correct the astigmatism of the beam in a direction orthogonal to the one direction.

13. The system according to claim 1 in which:
said moving means including means to produce orthogonal deflection voltages to deflect the beam to its location in the field;
and said ascertaining means includes:
means to receive the orthogonal deflection voltages that deflect the beam to its location in the field;
and means to process signals relating to the orthogonal deflection voltages received by said receiving means to locate the sector of the field in which the beam is located.

14. The system according to claim 1 in which said determining means includes means to indicate the location of the beam along two orthogonal directions relative to the center of the field.

15. The system according to claim 14 in which said indicating means includes:
first means to indicate the location of the beam along one of the two orthogonal directions relative to the center of the field in accordance with the deflection voltage of the beam in the one orthogonal direction, said first means including means to receive the deflection voltage of the beam in the one orthogonal direction;
and second means to indicate the location of the beam along the other of the two orthogonal directions relative to the center of the field in accordance with the deflection voltage of the beam in the other orthogonal direction, said second means including means to receive the deflection voltage of the beam in the other orthogonal direction.

16. The system according to claim 15 in which:
said correction means includes means to generate at least one voltage to correct the aberration in accordance with the location of the beam in the field relative to the center of the field;
and means to supply signals to said voltage generating means to cause said voltage generating means to generate the voltage in accordance with the deflection voltage received by said receiving means of said first indicating means and the deflection voltage received by said receiving means of said second indicating means.

17. The system according to claim 1 in which:
the aberration is the beam not being focused on a substantially flat target when the beam is not located at the center of the field;
and said correction means supplies a signal to focus means for the beam to change the focal length so that the beam is focused on the flat target at the location of the beam in the field.

18. The system according to claim 1 in which:
the aberration is the beam having an astigmatism when the beam is not located at the center of the field;
and said correction means supplies signals to means to correct the astigmatism of the beam.

19. The system according to claim 1 in which said correction means includes means to produce at least one correction signal to correct the aberration of the beam in accordance with the sector in which the beam is disposed and the beam's location within the sector.

20. The system according to claim 19 in which:
said moving means includes means to produce orthogonal deflection voltages to deflect the beam to each of its locations in the field;
and said ascertaining means includes:
means to receive the orthogonal deflection voltages that deflect the beam to its location in the field;
and means to process signals relating to the orthogonal deflection voltages received by said receiving means to locate the sector of the field in which the beam is located.

21. The system according to claim 20 in which said signal processing means including means to supply signals to said producing means of said correction means to cause said producing means of said correction means to produce the correction signal in accordance with the signals from said signal processing means.

22. The system according to claim 21 in which:
the aberration is the beam not being focused on a substantially flat target when the beam is not located at the center of the field;
said signal supply means of said signal processing means includes means to produce a pair of coefficients with each of the coefficients being determined by the sector of the field in which the beam is located;
said producing means of said correction means includes:
first means to multiply a first value related to at least one of the pair of coefficients and a second value related to both of the orthogonal deflection voltages to produce a portion of the correction signal;
and second means to multiply a third value related to at least the other of the pair of coefficients and a fourth value, different from the third value and related to both of the orthogonal deflection voltages, to produce another portion of the correction signal;
and means to supply the correction signal to focus means for the beam to change the focal length so that the beam is focused on the flat target at the location of the beam in the field.

23. The system according to claim 22 including means to change the value of each of the coefficients from said coefficient producing means when the value, related to the orthogonal deflection voltages and multiplied by the value of the coefficient in said corresponding multiplying means, is at zero.

24. The system according to claim 21 in which:
the aberration includes the beam having an astigmatism when the beam is not located in the center of the field;
said signal supply means of said signal processing means includes means to produce first and second pairs of coefficients with each of the coefficients of each of the pairs being determined by the sector of the field in which the beam is located;
said producing means of said correction means includes:
first means to multiply a first value related to one of the first pair of coefficients and a second value related to both of the orthogonal deflection voltages to produce a portion of a first correction signal;
second means to multiply a third value related to the other of the first pair of coefficients and a fourth value, different from the second value and related to both of the orthogonal deflection voltages, to produce another portion of the first correction signal;
third means to multiply a fifth value related to one of the second pair of coefficients and a sixth value related to both of the orthogonal deflection voltages to produce a portion of a second correction signal;
and fourth means to multiply a seventh value related to the other of the second pair of coefficients and an eighth value, different from the sixth value and related to both of the orthogonal deflection voltages, to produce another portion of the second correction signal;
first supply means to supply the first correction signal to first stigmator means to correct the astigmatism of the beam in one direction;
and second supply means to supply the second correction signal to second stigmator means to correct the astigmatism of the beam in a direction orthogonal to the one direction.

25. The system according to claim 24 including means to change the value of each of the coefficients from said coefficient producing means when the value, related to the orthogonal deflection voltage and multiplied by the value of the coefficient in said corresponding multiplying means, is at zero.

26. The system according to claim 21 in which:
the aberration includes the beam having an astigmatism when the beam is not located in the center of the field;
said signal supply means of said signal processing means includes means to produce first and second pairs of coefficients with each of the coefficients of each of the pairs being determined by the sector of the field in which the beam is located;
said producing means of said correction means includes:
first means to multiply a first value related to at least one of the first pair of coefficients and a second value related to both of the orthogonal deflection voltages to produce a portion of a first correction signal;
second means to multiply a third value related to at least the other of the first pair of coefficients and a fourth value, different from the second value and related to both of the orthogonal deflection voltages, to produce another portion of the first correction signal;
third means to multiply a fifth value related to at least one of the second pair of coefficients and a sixth value related to both of the orthogonal deflection voltages to produce a portion of a second correction signal;
and fourth means to multiply a seventh value related to at least the other of the second pair of coefficients and an eighth value, different from the sixth value and related to both of the orthogonal deflection voltages, to produce another portion of the second correction signal;
first supply means to supply the first correction signal to first stigmator means to correct the astigmatism of the beam in one direction;
and second supply means to supply the second correction signal to second stigmator means to correct the astigmatism of the beam in a direction orthogonal to the one direction.

27. The system according to claim 21 in which:
the aberration includes the beam not being focused on a substantially flat target when the beam is not located at the center of the field and the beam having an astigmatism when the beam is not located at the center of the field;
said signal supply means of said signal processing means includes means to produce first, second, and third pairs of coefficients with the value of each of the coefficients of each of the pairs being determined by the sector of the field in which the beam is located;
said producing means of said correction means includes:

first means to multiply a first value related to at least one of the first pair of coefficients and a second value related to both of the orthogonal deflection voltages to produce a portion of a first correction signal;

second means to multiply a third value related to at least the other of the first pair of coefficients and a fourth value, different from the second value and related to both of the orthogonal deflection voltages, to produce another portion of the first correction signal;

third means to multiply a fifth value related to one of the second pair of coefficients and a sixth value related to both of the orthogonal deflection voltages to produce a portion of a second correction signal;

fourth means to multiply a seventh value related to the other of the second pair of coefficients and an eighth value, different from the sixth value and related to both of the orthogonal deflection voltages, to produce another portion of the second correction signal;

fifth means to multiply a ninth value related to one of the third pair of coefficients and a tenth value related to both of the orthogonal deflection voltages to produce a portion of a third correction signal;

and sixth means to multiply an eleventh value related to the other of the third pair of coefficients and a twelfth value, different from the tenth value and related to both of the orthogonal deflection voltages, to produce another portion of the third correction signal;

first supply means to supply the first correction signal to focus means for the beam to change the focal length so that the beam is focused on the flat target at the location of the beam in the field;

second supply means to supply the second correction signal to first stigmator means to correct the astigmatism of the beam in one direction;

and third supply means to supply the third correction signal to second stigmator means to correct the astigmatism of the beam in a direction orthogonal to the one direction.

28. The system according to claim 27 including means to change the value of each of the coefficients from said coefficient producing means when the value, related to the orthogonal deflection voltages and multiplied by the value by the coefficient in said corresponding multiplying means, is at zero.

29. The system according to claim 21 in which:
the aberration includes the beam not being focused on a substantially flat target when the beam is not located at the center of the field and the beam having an astigmatism when the beam is not located at the center of the field;
said signal supply means of said signal processing means includes means to produce first, second, and third pairs of coefficients with the value of each of the coefficients of each of the pairs being determined by the sector of the field in which the beam is located;
said producing means of said correction means includes:
first means to multiply a first value related to at least one of the first pair of coefficients and a second value related to both of the orthogonal deflection voltages to produce a portion of a first correction signal;

second means to multiply a third value related to at least the other of the first pair of coefficients and a fourth value, different from the second value and related to both of the orthogonal deflection voltages, to produce another portion of the first correction signal;

third means to multiply a fifth value related to at least one of the second pair of coefficients and a sixth value related to both of the orthogonal deflection voltages to produce a portion of a second correction signal;

fourth means to multiply a seventh value related to at least the other of the second pair of coefficients and an eighth value, different from the sixth value and related to both of the orthogonal deflection voltages, to produce another portion of the second correction signal;

fifth means to multiply a ninth value related to at least one of the third pair of coefficients and a tenth value related to both of the orthogonal deflection voltages to produce a portion of a third correction signal;

and sixth means to multiply an eleventh value related to at least the other of the third pair of coefficients and a twelfth value, different from the tenth value and related to both of the orthogonal deflection voltages, to produce another portion of the third correction signal;

first supply means to supply the first correction signal to focus means for the beam to change the focal length so that the beam is focused on the flat target at the location of the beam in the field;

second supply means to supply the second correction signal to first stigmator means to correct the astigmatism of the beam in one direction;

and third supply means to supply the third correction signal to second stigmator means to correct the astigmatism of the beam in a direction orthogonal to the one direction.

30. The system according to claim 21 in which:
the aberration includes the beam not being focused on a substantially flat target when the beam is not located at the center of the field and the beam having an astigmatism when the beam is not located at the center of the field;
and said producing means including:
first correction signal producing means to produce a first correction signal for supply to focus means for the beam to change the focal length so that the beam is focused on the flat target at the location of the beam in the field;
second correction signal producing means to produce a second correction signal to first stigmator means to correct the astigmatism of the beam in one direction;
and third correction signal producing means to produce a third correction signal to second stigmator means to correct the astigmatism of the beam in a direction orthogonal to the one direction.

31. A method for automatically correcting the aberration of a beam of charged particles as the beam is moved from the center of a deflection field including:
moving the beam to any position within the field;

electronically dividing the field into a plurality of sectors by lines passing through the center of the field;

electronically determining any of the locations of the beam within the field to which the beam is moved by electronically determining in which sector the beam is located;

and correcting the aberration of the beam in accordance with the location of the beam in the field relative to the center of the field so that the beam has no aberration at its location in the field.

32. The method according to claim 31 including generating a voltage to correct the aberration of the beam in accordance with the sector in which the beam is disposed and the beam's location within the sector.

33. The method according to claim 31 in which the beam is moved by a deflection voltage applied in each of two orthogonal directions and the sector in which the location of the beam in the sector is determined by processing signals related to the orthogonal deflection voltages that deflect the beam to its location in the field.

34. The method according to claim 33 including:
the aberration including the beam not being focused on a substantially flat target when the beam is not located at the center of the field;
electronically producing a pair of coefficients with each of the coefficients being determined by the sector of the field in which the beam is located;
and generating a voltage for supply to focus means for the beam to change the focal length so that the beam is focused on the flat target at the location of the beam in the field by electronically multiplying a first value related to at least one of the coefficients and a first voltage related to both of the orthogonal deflection voltages to produce a portion of the generated voltage and electronically multiplying a second value related to at least the other of the coefficients and a second voltage and related to both of the orthogonal deflection voltages to produce another portion of the generated voltage.

35. The method according to claim 34 including changing the value of each of the coefficients when the related voltage, multiplied by the value of the coefficient, is at zero.

36. The method according to claim 33 including:
the aberration including the beam having an astigmatism when the beam is not located at the center of the field;
electronically producing first and second pairs of coefficients with the value of each of the coefficients of each of the pairs being determined by the sector of the field in which the beam is located;
generating a first voltage for supply to first stigmator means to correct the astigmatism of the beam in one direction by electronically multiplying a first value related to one of a first pair of coefficients and a first voltage related to both of the orthogonal deflection voltages to produce a portion of the first generated voltage and electronically multiplying a second value related to the other of the first pair of coefficients and a second voltage, different from the first voltage and related to both of the orthogonal deflection voltages, to produce another portion of the first generated voltage;
and generating a second voltage for supply to second stigmator means to correct the astigmatism of the beam in a direction orthogonal to the one direction by electronically multiplying a third value related to one of a second pair of coefficients and a third voltage related to both of the orthogonal deflection voltages to produce a portion of the second generated voltage and electronically multiplying a fourth value related to the other of the second pair of coefficients and a fourth voltage, different from the third voltage and related to both of the orthogonal deflection voltages, to produce another portion of the second generated voltage.

37. The method according to claim 36 including changing the value of each of the coefficients when the related voltage, multiplied by the value of the coefficient, is at zero.

38. The method according to claim 33 including:
the aberration including the beam having an astigmatism when the beam is not located at the center of the field;
electronically producing first and second pairs of coefficients with the value of each of the coefficients of each of the pairs being determined by the sector of the field in which the beam is located;
generating a first voltage for supply to first stigmator means to correct the astigmatism of the beam in one direction by electronically multiplying a first value related to at least one of a first pair of coefficients and a first voltage related to both of the orthogonal deflection voltages to produce a portion of the first generated voltage and electronically multiplying a second value related to at least the other of the second pair of coefficients and a second voltage, different from the first voltage and related to both of the orthogonal deflection voltages, to produce another portion of the first generated voltage;
and generating a second voltage for supply to second stigmator means to correct the astigmatism of the beam in a direction orthogonal to the one direction by electronically multiplying a third value related to at least one of a second pair of coefficients and a third voltage related to both of the orthogonal deflection voltages to produce a portion of the second generated voltage and electronically multiplying a fourth value related to at least the other of the second pair of coefficients and a fourth voltage, different from the third voltage and related to both of the orthogonal deflection voltages, to produce another portion of the second generated voltage.

39. The method according to claim 33 including:
the aberration including the beam not being focused on a substantially flat target when the beam is not located at the center of the field and the beam having an astigmatism when the beam is not located at the center of the field;
electronically producing first, second, and third pairs of coefficients with each of the coefficients of each of the pairs being determined by the sector of the field in which the beam in located;
generating a first voltage for supply to focus means for the beam to change the focal length so that the beam is focused on the flat target at the location of the beam in the field by electronically multiplying a first value related to at least one of a first pair of coefficients and a first voltage related to both of the orthogonal deflection voltages to produce a portion of the first generator voltage and electronically multiplying a second value related to at least the other of the first pair of coefficients and a second voltage, different from the first voltage and related to both of the orthogonal deflection voltages, to produce another portion of the first generated voltage;

generating a second voltage for supply to first stigmator means to correct the astigmatism of the beam in one direction by electronically multiplying a third value related to one of a second pair of coefficients and a third voltage related to both of the orthogonal deflection voltages to produce a portion of the second generated voltage and electronically multiplying a fourth value related to the other of the second pair of coefficients and a fourth voltage, different from the third voltage and related to both of the orthogonal deflection voltages, to produce another portion of the second generated voltage;

and generating a third voltage for supply to second stigmator means to correct the astigmatism of the beam in a direction orthogonal to the one direction by electronically multiplying a fifth value related to one of a third pair of coefficients and a fifth voltage related to both of the orthogonal deflection voltages to produce a portion of the third generated voltage and electronically multiplying a sixth value related to the other of the third pair of coefficients and a sixth voltage, different from the fifth voltage and related to both of the orthogonal deflection voltages, to produce another portion of the third generated voltage.

40. The method according to claim 39 including changing the value of each of the coefficients when the related voltage, multiplied by the value of the coefficient, is at zero.

41. The method according to claim 33 including:

the aberration including the beam not being focused on a substantially flat target when the beam is not located at the center of the field and the beam having an astigmatism when the beam is not located at the center of the field;

electronically producing first, second, and third pairs of coefficients with each of the coefficients of each of the pairs being determined by the sector of the field in which the beam is located;

generating a first voltage for supply to focus means for the beam to change the focal length so that the beam is focused on the flat target at the location of the beam in the field by electronically multiplying a first value related to at least one of a first pair of coefficients and a first voltage related to both of the orthogonal deflection voltages to produce a portion of the first generated voltage and electronically multiplyng a second value related to at least the other of the first pair of coefficients and a second voltage, different from the first voltage and related to both of the orthogonal deflection voltages, to produce another portion of the first generated voltage;

generating a second voltage for supply to first stigmator means to correct the astigmatism of the beam in one direction by electronically multiplying a third value related to at least one of a second pair of coefficients and a third voltage related to both of the orthogonal deflection voltages to produce a portion of the second generated voltage and electronically multiplying a fourth value related to at least the other of the second pair of coefficients and a fourth voltage, different from the third voltage and related to both of the orthogonal deflection voltages, to produce another portion of the second generated voltage;

and generating a third voltage for supply to second stigmator means to correct the astigmatism of the beam in a direction orthogonal to the one direction by electronically multiplying a fifth value related to at least one of a third pair of coefficients and a fifth voltage related to both of the orthogonal deflection voltages to produce a portion of the third generated voltage and electronically multiplying a sixth value related to at least the other of the third pair of coefficients and a sixth voltage, different from the fifth voltage and related to both of the orthogonal deflection voltages, to produce another portion of the third generated voltage.

42. The method according to claim 13 in which the beam is moved by a deflection voltage applied in each of two orthogonal directions and the sector in which the location of the beam in the sector is determined by processing signals related to the orthogonal deflection voltage that deflect the beam to its location in the field.

43. The method according to claim 31 including electronically determining the location of the beam along each of two orthogonal directions in the field with respect to the center of the field.

44. The method according to claim 43 in which the beam is moved by a deflection voltage applied in each of the two orthogonal directions and the deflection voltage of the beam in each of the orthogonal directions is employed to indicate the location of the beam in the field.

45. The method according to claim 43 in which:

the aberration is the beam not being focused on a substantially flat target when the beam is not located at the center of the field;

and supplying a voltage in accordance with the location of the beam in the field relative to the center of the field to focus means for focusing the beam so that the beam is focused on the flat target at the location of the beam in the field.

46. The method according to claim 31 in which:

the aberration is the beam having an astigmatism when the beam is not located at the center of the field;

and supplying voltages in accordance with the location of the beam in the field relative to the center of the field to means for correcting the astigmatism of the beam.

47. The method according to claim 31 including producing at least one correction signal to correct the aberration of the beam in accordance with the sector in which the beam is disposed and the beam's location within the sector.

48. The method according to claim 47 in which the beam is moved by a deflection voltage applied in each of two orthogonal directions and the sector in which the location of the beam in the sector is determined by electronically processing signals related to the orthogonal deflection voltages that deflect the beam to its location in the field.

49. The method according to claim 48 including:

the aberration including the beam not being focused on a substantially flat target when the beam is not located at the center of the field;

electronically producing a pair of coefficients with each of the coefficients being determined by the sector of the field in which the beam is located;

and producing a correction signal for supply to focus means for the beam to change the focal length so that the beam is focused on the flat target at the location of the beam in the field by electronically multiplying a first value related to at least one of the pair of coefficients and a second value related to both of the orthogonal deflection voltages to produce a portion of the correction signal and electronically multiplying a third value related to at least the other of the pair of coeffficients and a fourth value, different from the second value and related to both of the orthogonal deflection voltages, to produce another portion of the correction signal.

50. The method according to claim 49 including changing the value of each of the coefficients when the value, related to the orthogonal deflection voltages and multiplied by the value of the coefficient, is at zero.

51. The method according to claim 48 including:
the aberration including the beam having an astigmatism when the beam is not located in the center of the field;
electronically producing first and second pairs of coefficients with each of the coefficients of each of the pairs being determined by the sector of the field in which the beam is located;
producing a first correction signal for supply to first stigmator means to correct astigmatism of the beam in one direction by electronically multiplying a first value related to one of the first pair of coefficients and a second value related to both of the orthogonal deflection voltages to produce a portion of the first correction signal and electronically multiplying a third value related to the other of the first pair of coefficients and a fourth value, different from the second value and related to both of the orthogonal deflection voltages, to produce another portion of the first correction signal;
and producing a second correction signal for supply to second stigmator means to correct the astigmatism of the beam in a direction orthogonal to the one direction by electronically multiplying a fifth value related to one of the second pair of coefficients and a sixth value related to both of the orthogonal deflection voltages to produce a portion of the second correction signal and electronically multiplying a seventh value related to the other of the second pair of coefficients and an eighth value, different from the sixth value and related to both of the orthogonal deflection voltages, to produce another portion of the second correction signal.

52. The method according to claim 51 including changing the value of each of the coefficients when the value, related to the orthogonal deflection voltages and multiplied by the value of the coefficient, is at zero.

53. The method according to claim 48 including:
the aberration including the beam having an astigmatism when the beam is not located in the center of the field;
electronically producing first and second pairs of coefficients with each of the coefficients of each of the pairs being determined by the sector of the field in which the beam is located;
producing a first correction signal for supply to first stigmator means to correct astigmatism of the beam in one direction by electronically multiplying a first value related to at least one of the first pair of coefficients and a second value related to both of the orthogonal deflection voltages to produce a portion of the first correction signal and electronically multiplying a third value related to at least the other of the first pair of coefficients and a fourth value, different from the second value and related to both of the orthogonal deflection voltages, to produce another portion of the first correction signal;
and producing a second correction signal for supply to second stigmator means to correct the astigmatism of the beam in a direction orthogonal to the one direction by electronically multiplying a fifth value related to at least one of the second pair of coefficients and a sixth value related to both of the orthogonal deflection voltages to produce a portion of the second correction signal and electronically multiplying a seventh value related to at least the other of the second pair of coefficients and an eighth value, different from the sixth value and related to both of the orthogonal deflection voltages, to produce another portion of the second correction signal.

54. The method according to claim 48 including:
the aberration including the beam not being focused on a substantially flat target when the beam is not located at the center of the field and the beam having an astigmatism when the beam is not located at the center of the field;
electronically producing first, second, and third pairs of coefficients with each of the coefficients of each of the pairs being determined by the sector of the field in which the beam is located;
producing a first correction signal for supply to focus means for the beam to change the focal length so that the beam is focused on the flat target at the location of the beam in the field by electronically multiplying a first value related to at least one of a first pair of coefficients and a second value related to both of the orthogonal deflection voltages to produce a portion of the first correction signal and electronically multiplying a third value related to at least the other of the first pair of coefficients and a fourth value, different from the second value and related to both of the orthogonal deflection voltages, to produce another portion of the first correction signal;
producing a second correction signal for supply to first stigmator means to correct the astigmatism of the beam in one direction by electronically multiplying a fifth value related to one of a second pair of coefficients and a sixth value related to both of the orthogonal deflection voltages to produce a portion of the second correction signal and electronically multiplying a seventh value related to the other of the second pair of coefficients and an eighth value, different from the sixth value and related to both of the orthogonal deflection voltages, to produce another portion of the second correction signal;
and producing a third correction signal for supply to second stigmator means to correct the astigmatism of the beam in a direction orthogonal to the one direction by electronically multiplying a ninth value related to one of a third pair of coefficients and a tenth value related to both of the orthogonal deflection voltages to produce a portion of the third correction signal and electronically multiplying an eleventh value related to the other of the third pair of coefficients and a twelfth value, different from the tenth value and related to both of the orthogonal deflection voltages, to produce another portion of the third correction signal.

55. The method according to claim 54 including changing the value of each of the coefficients when the value, related to the orthogonal deflection voltages and multiplied by the value of the coefficient, is at zero.

56. The method according to claim 48 including:

the aberration including the beam not being focused on a substantially flat target when the beam is not located at the center of the field and the beam having an astigmatism when the beam is not located at the center of the field;

electronically producing first, second, and third pairs of coefficients with each of the coefficients of each of the pairs being determined by the sector of the field in which the beam is located;

producing a first correction signal for supply to focus means for the beam to change the focal length so that the beam is focused on the flat target at the location of the beam in the field by electronically multiplying a first value related to at least one of a first pair of coefficients and a second value related to both of the orthogonal deflection voltages to produce a portion of the first correction signal and electronically multiplying a third value related to at least the other of the first pair of coefficients and a fourth value, different from the second value and related to both of the orthogonal deflection voltages, to produce another portion of the first correction signal;

producing a second correction signal for supply to first stigmator means to correct the astigmatism of the beam in one direction by electronically multiplying a fifth value related to at least one of a second pair of coefficients and a sixth value related to both of the orthogonal deflection voltages to produce a portion of the second correction signal and electronically multiplying a seventh value related to at least the other of the second pair of coefficients and an eighth value, different from the sixth value and related to both of the orthogonal deflection voltages, to produce another portion of the second correction signal;

and producing a third correction signal for supply to second stigmator means to correct the astigmatism of the beam in a direction orthogonal to the one direction by electronically multiplying a ninth value related to at least one of a third pair of coefficients and a tenth value related to both of the orthogonal deflection voltages to produce a portion of the third correction signal and electronically multiplying an eleventh value related to at least the other of the third pair of coefficients and a twelfth value, different from the tenth value and related to both of the orthogonal deflection voltages, to produce another portion of the third correction signal.

57. The method according to claim 48 including:

the aberration including the beam not being focused on a substantially flat target when the beam is not located at the center of the field and the beam having an astigmatism when the beam is not located at the center of the field;

producing a first correction signal for supply to focus means for the beam to change the focal length so that the beam is focused on the flat target at the location of the beam in the field;

producing a second correction signal in accordance with the location of the beam in the field relative to the center of the field for supply to first stigmator means for correcting astigmatism of the beam in one direction;

and producing a third correction signal in accordance with the location of the beam in the field relative to the center of the field for supply to second stigmator means for correcting astigmatism of the beam in a direction orthogonal to the one direction.

* * * * *